US012224176B2

(12) United States Patent
Guo (10) Patent No.: US 12,224,176 B2
(45) Date of Patent: Feb. 11, 2025

(54) METHOD FOR FORMING FIN STRUCTURE IN FIN FIELD EFFECT TRANSISTOR PROCESS AND FIN STRUCTURE

(71) Applicant: Shanghai Huali Integrated Circuit Corporation, Shanghai (CN)

(72) Inventor: Xiaobo Guo, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 289 days.

(21) Appl. No.: 17/950,812

(22) Filed: Sep. 22, 2022

(65) Prior Publication Data
US 2023/0170225 A1 Jun. 1, 2023

(30) Foreign Application Priority Data
Nov. 26, 2021 (CN) .......................... 202111417800.X (51) Int. Cl.
*H01L 21/308* (2006.01)
*H01L 23/544* (2006.01)

(52) U.S. Cl.
CPC ........ *H01L 21/3086* (2013.01); *H01L 23/544* (2013.01); *H01L 2223/54426* (2013.01)

(58) Field of Classification Search
CPC ........... H01L 29/66795; H01L 21/0332; H01L 21/0334; H01L 21/0335; H01L 21/0337; H01L 21/0338; H01L 21/823431; H01L 27/0886; H01L 29/785
See application file for complete search history.

(56) References Cited

U.S. PATENT DOCUMENTS

2016/0247766 A1* 8/2016 Conklin .............. H01L 21/0337

* cited by examiner

*Primary Examiner* — Walter H Swanson
(74) *Attorney, Agent, or Firm* — Banner & Witcoff, Ltd.

(57) ABSTRACT

The application discloses a method for forming a fin structure in a fin field effect transistor process, which includes: performing photolithography and etching for a first time to form a first core layer pattern and a second core layer pattern, and depositing an etching mask layer; etching back the etching mask layer to form sidewalls of the first core layer pattern and sidewalls of the second core layer pattern; performing photolithography for a second time; etching the substrate for a first time to form fins and a planar active area consisting of a substrate material; removing sidewalls of a first photoresist pattern, a second photoresist pattern and the second core layer pattern, and reserving the second core layer pattern; performing photolithography for a third time; etching the substrate for a second time to form reference layer overlay mark and a fin cut area consisting of the substrate material.

20 Claims, 7 Drawing Sheets

METHOD FOR FORMING FIN STRUCTURE IN FIN FIELD EFFECT TRANSISTOR PROCESS AND FIN STRUCTURE

CROSS-REFERENCE TO RELATED APPLICATIONS

This application claims the priority to Chinese Patent Application No. 202111417800.X, filed on Nov. 26, 2021, the disclosure of which is incorporated herein by reference in its entirety.

TECHNICAL FIELD

The present application relates to the field of semiconductor integrated circuit manufacturing, in particular to a method for forming a fin structure in a fin field effect transistor process and a fin structure.

BACKGROUND

Figure 1:
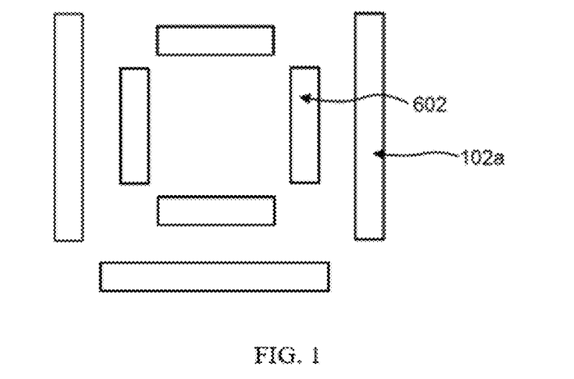
FIG. 1 illustrates a schematic diagram of an overlay mark.

The overlay accuracy of photolithography is one of the key parameters to measure the photolithography process. It refers to the offset between the upper and lower layers of patterns on a silicon wafer. FIG. 1 illustrated commonly used overlay accuracy measurement marks (hereinafter referred to as overlay marks) in the photolithography process, in which 102a is an overlay mark of a reference layer (aligned layer), which is formed on the silicon wafer after the photolithography and etching processes, 602 is an overlay mark of a current layer (aligning layer), which is a pattern composed of photoresist formed on the silicon wafer after photolithography. The overlay accuracy is obtained by measuring the offset between the current layer overlay mark 602 and the reference layer overlay mark 102a. Therefore, the quality of the overlay mark will directly affect the measurement of the overlay accuracy. In particular, the reference layer overlay mark 102a needs to go through many process steps, such as chemical-mechanical polishing, etching, cleaning and thin film deposition. These processes will have an influence on the reference layer overlay mark 102a.

Figure 2:
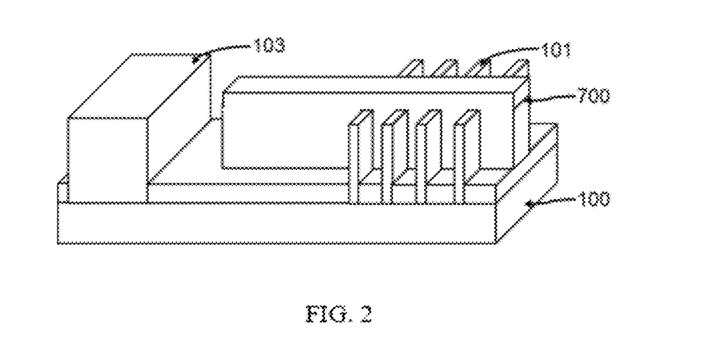
FIG. 2 illustrates a schematic diagram of a fin field effect transistor.

The increasing integration of the semiconductor device promotes the continuous development of the technical node of the semiconductor manufacturing process. When it develops to the 14 nm process, the structure of the transistor also develops from the planar structure to the three-dimensional fin field effect transistor (FinFET) structure. Referring to FIG. 2, the source, drain and channel of the transistor consist of high and thin fins 101, and the gate 700 is close to the two sidewalls and top of the fins 101, thereby increasing the channel area, facilitating the control of the channel by the gate 700 and greatly improving the leakage current of the channel.

Figure 3:
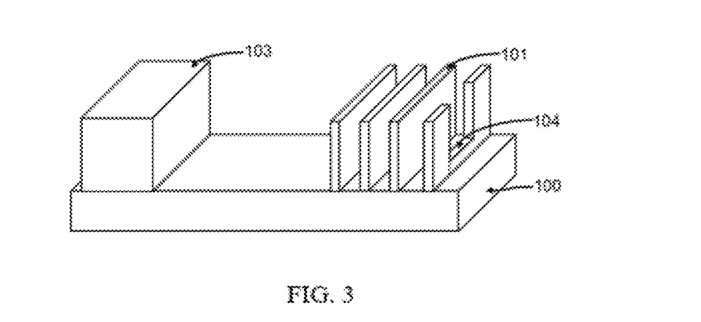
FIG. 3 illustrates a schematic diagram of a fin structure in a traditional fin field effect transistor.
Figure 4:
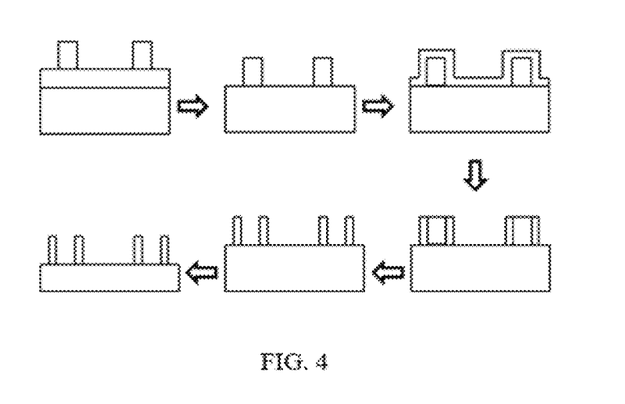
FIG. 4 illustrates a sectional schematic diagram of a self-aligned double patterning process.
Figure 5:
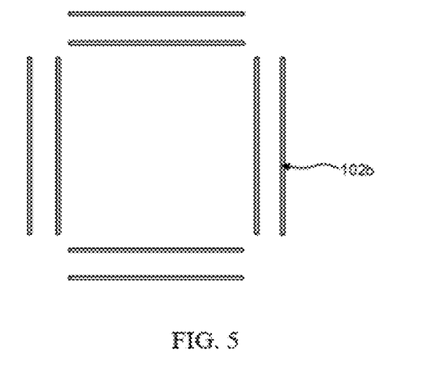
FIG. 5 illustrates a schematic diagram of a transitional overlay mark after a self-aligned double patterning process.

FIG. 3 illustrates a schematic diagram of a typical fin structure in a fin field effect transistor, in which 103 is a Planar Active Area (PAA) which is a non-fin area and is used to place some test patterns; 104 is a fin cut area, which is used to cut specific fins or fin ends; 101 is a fin, which is used to form a source, a drain and a channel of the transistor, and is the most important structure in the fin field effect transistor. To form the fin structure illustrated in FIG. 3, the common method is to use a combination of Self-Aligned Double Patterning (SADP) and two times of additional photolithography. The two times of additional photolithography are used to form the planar active area 103 and the fin cut area 104, and the self-aligned double patterning process is used to form the fins 101. A simplified process is as illustrated in FIG. 4, in which a core layer is generally a reference layer for subsequent photolithography layer overlay accuracy, so it is necessary to design the reference layer overlay mark (102a as illustrated in FIG. 1) on the core layer for the measurement of the subsequent photolithography layer overlay accuracy. After undergoing the self-aligned double patterning process as illustrated in FIG. 4, the reference layer overlay mark 102a illustrated in FIG. 1 will become the type as illustrated in FIG. 5, that is, one line of the reference layer overlay mark 102a (with a width of 1000-10000 nm) will become two very thin lines (the width is the same as the width of the fin, which is 5-20 nm). Such reference layer overlay mark 102b cannot be recognized by an overlay accuracy measuring machine. As a result, the subsequent photolithography layer overlay accuracy cannot be measured.

Figure 6:
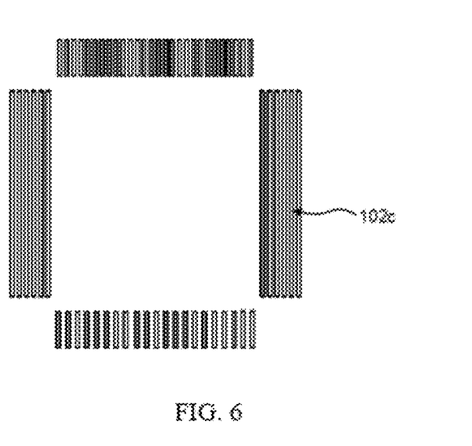
FIG. 6 illustrates a schematic diagram of a segmentation overlay mark after a self-aligned double patterning process.

In order to solve the above problem of measuring the overlay accuracy, the general practice is to split each line of the reference layer overlay mark 102a illustrated in FIG. 1 into several thin lines, and then form the reference layer overlay mark 102c illustrated in FIG. 6 consisting of a plurality of thin lines (the width is the same as the width of the fin, which is 5-20 nm) after the self-aligned double patterning process illustrated in FIG. 4. Although such reference layer overlay mark 102c can be recognized by the measuring equipment and used for the measurement of subsequent photolithography layer overlay accuracy, since the width of these thin lines is too small and only 5-20 nm wide, after subsequent chemical-mechanical polishing, etching, cleaning, thin film deposition and other processes, the overlay mark 102c is easily destroyed, resulting in inaccurate measurement of subsequent photolithography layer overlay accuracy.

BRIEF SUMMARY

In order to solve the technical problem, the present application provides a method for forming a fin structure in a fin field effect transistor process. The method for forming the fin structure in the fin field effect transistor process includes:

step S1: growing a core layer thin film on a substrate;

step S2: performing photolithography and etching for a first time to form a first core layer pattern and a second core layer pattern, the first core layer pattern being used to form fins and the second core layer pattern being used to form a reference layer overlay mark;

step S3: depositing an etching mask layer, the etching mask layer covering tops and side surfaces of the first core layer pattern and the second core layer pattern, and a surface of the substrate;

step S4: etching back the etching mask layer to form sidewalls of the first core layer pattern and sidewalls of the second core layer pattern;

step S5: performing photolithography for a second time to form a first photoresist pattern and a second photoresist pattern, the first photoresist pattern being used to form a planar active area and the second photoresist pattern covering the second core layer pattern;

step S6: removing the first core layer pattern, reserving the sidewalls of the first core layer pattern, and reserving the second photoresist pattern and the first photoresist pattern;

step S7: etching the substrate for a first time to form the fins and the planar active area consisting of a substrate material;

step S8: removing the sidewalls of the first photoresist pattern, the second photoresist pattern and the second core layer pattern, and reserving the second core layer pattern;

step S9: performing photolithography for a third time to form a third photoresist pattern which covers all the planar active area and fins outside a fin cut area, and expose the second core layer pattern and the fins inside the fin cut area;

step S10: etching the substrate for a second time to form at least one reference layer overlay mark and fin cut area consisting of the substrate material.

Exemplarily, the core layer thin film is one of a single-layer dielectric film layer, a single-layer metal film layer or a single-layer metal compound film layer.

Exemplarily, the core layer thin film is a multilayer film layer and the multilayer film layer consists of a dielectric film layer and/or a metal film layer and/or a metal compound film layer.

Exemplarily, the core layer thin film is amorphous silicon.

Exemplarily, in step S1, at least one hard mask layer is grown before and/or after the core layer thin film is grown.

Exemplarily, in step S2, the photolithography for the first time is used as a reference layer for subsequent photolithography layer alignment and overlay; on the mask used in the photolithography for the first time, one or more reference layer overlay mark patterns with different widths or types are capable of being designed according to process requirements.

Exemplarily, the number of the second core layer patterns is more than one and the widths of the second core layer patterns are different.

Exemplarily, the number of the second core layer patterns is more than one and the types of the second core layer patterns are different.

Exemplarily, the etching selection ratio of the material of the etching mask layer to the material of the core layer thin film is more than 3:1.

Exemplarily, the etching selection ratio of the material of the etching mask layer to the material of the substrate is more than 3:1.

Exemplarily, in step S4, after the etching mask layer is etched back, the tops of the first core layer pattern and the second core layer pattern and the surface of the substrate are exposed.

Exemplarily, the etching selection ratio of the material of the first core layer pattern to the material of the sidewalls of the first core layer pattern is more than 3:1.

Exemplarily, the etching selection ratio of the material of the first core layer pattern to the material of the first photoresist pattern and the material of the second photoresist pattern is more than 3:1.

Exemplarily, in step S7, the substrate is etched for the first time by using the sidewalls of the second photoresist pattern, the first photoresist pattern and the first core layer pattern as an etching mask.

Exemplarily, in step S10, the substrate is etched for the second time by using the third photoresist pattern and the second core layer pattern as an etching mask.

Exemplarily, the width of the reference layer overlay mark is determined by the width of the second core layer pattern.

Exemplarily, the type of the reference layer overlay mark is determined by the type of the second core layer pattern.

The present application further provides a fin structure of a fin field effect transistor, which is fabricated by adopting the method for forming the fin structure in the fin field effect transistor process. The fin structure includes fins, a planar active area, a fin cut area and a reference layer overlay mark consisting of a substrate material; the width of the reference layer overlay mark is greater than the width of the fin. The width of the reference layer overlay mark is greater than the minimum width capable of being recognized by an overlay accuracy measuring machine.

Compared with the prior art, by forming a plurality of core layer patterns in the three times of photolithography, combined with the innovative process, on the basis of forming the fins, the planar active area and the fin cut area of the traditional fin field effect transistor, a reference layer overlay mark is formed at the same time, the width of the reference layer overlay mark can be freely adjusted according to the process requirements, and the type of the reference layer overlay mark can also be designed freely according to the process requirements (while in the traditional process, the width of the reference layer overlay mark is equal to the width of the fin, the size is small and cannot be adjusted, and the type of the overlay mark cannot be designed freely), thus solving the problem that the reference layer overlay mark in the traditional fin field effect transistor process is easily destroyed by subsequent multiple processes, and thus solving the problem of inaccurate measurement of subsequent photolithography layer overlay accuracy.

DETAILED DESCRIPTION OF THE APPLICATION

Figure 7:
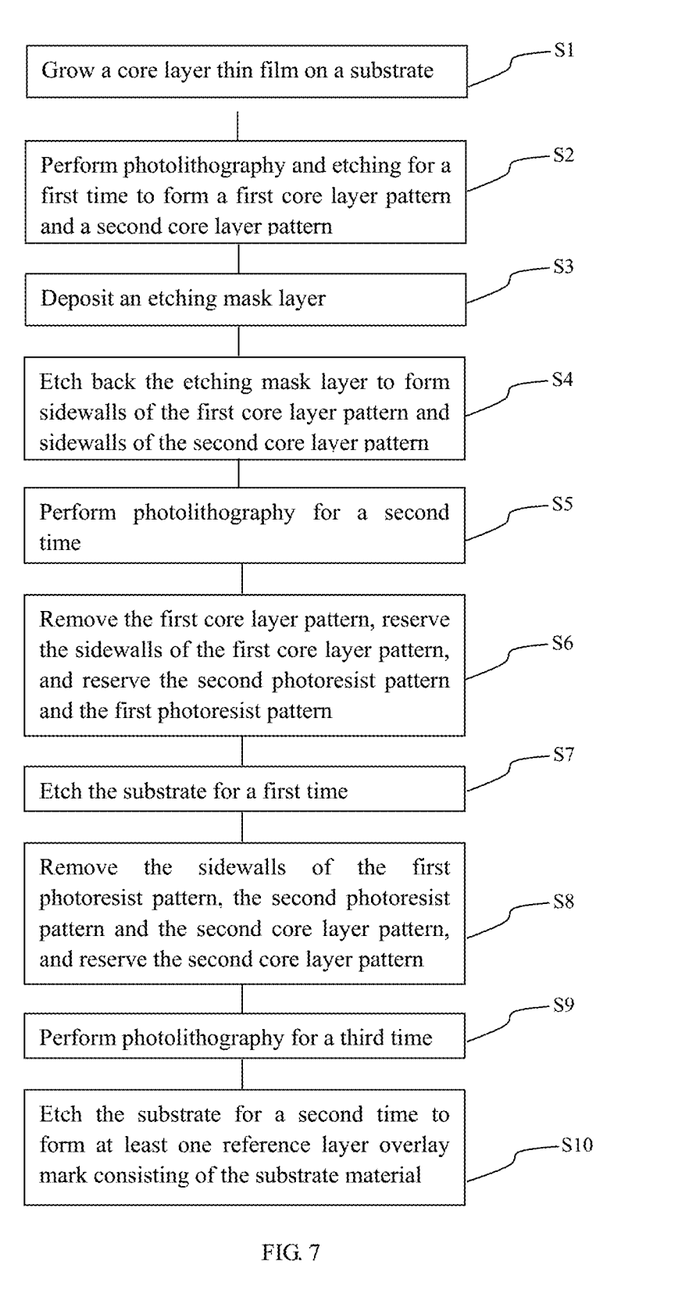
FIG. 7 illustrates a flowchart of a method for forming a fin structure in a fin field effect transistor process according to an embodiment.

Referring to FIG. 7, the present application provides a method for forming a fin structure in a fin field effect transistor process, which includes:

step S1: growing a core layer thin film on a substrate;

step S2: performing photolithography and etching for a first time to form a first core layer pattern and a second core layer pattern, the first core layer pattern being used to form fins, the second core layer pattern being used to form a reference layer overlay mark, the number of the first core layer pattern being at least one, and the number of the second core layer pattern being at least one;

step S3: depositing an etching mask layer, the etching mask layer covering tops and side surfaces of the first core layer pattern and the second core layer pattern, and a surface of the substrate;

step S4: etching back the etching mask layer to form sidewalls of the first core layer pattern and sidewalls of the second core layer pattern, and expose the tops of the first core layer pattern and the second core layer pattern, and the surface of the substrate;

step S5: performing photolithography for a second time to form a first photoresist pattern and a second photoresist pattern, the first photoresist pattern being used to form a planar active area and the second photoresist pattern covering the second core layer pattern;

step S6: removing the first core layer pattern, reserving the sidewalls of the first core layer pattern, and reserving the second photoresist pattern and the first photoresist pattern;

step S7: etching the substrate for a first time to form the fins and the planar active area consisting of a substrate material;

step S8: removing the sidewalls of the first photoresist pattern, the second photoresist pattern and the second core layer pattern, and reserving the second core layer pattern;

step S9: performing photolithography for a third time to form a third photoresist pattern which covers all the planar active area and fins outside a fin cut area, and expose the second core layer pattern and the fins inside the fin cut area;

step S10: etching the substrate for a second time to form at least one reference layer overlay mark and fin cut area consisting of the substrate material.

The method for forming the fin structure is further described in detail below in combination with the specific structure of the fin field effect transistor in the steps of the method.

Figure 8:
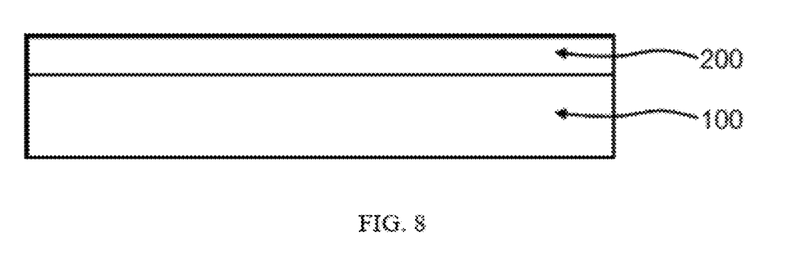
FIG. 8-17 illustrate sectional schematic diagrams of a fin structure in a fin field effect transistor in each step in embodiments.

In step S1, referring to FIG. 8, a core layer thin film 200 is grown on a substrate 100. The substrate 100 is used to form a final fin structure. Exemplarily, the substrate 100 is a silicon wafer. The substrate 100 may also include an elemental semiconductor (such as silicon or germanium in a crystal structure), a compound semiconductor (such as silicon germanium, silicon carbide, gallium arsenide, gallium phosphide, indium phosphide, indium arsenide or indium antimonide).

The core layer thin film 200 may be a single-layer dielectric film layer or a single-layer metal film layer or a single-layer metal compound film layer, or a multilayer film layer consisting of a dielectric film layer and/or a metal film layer and/or a metal compound film layer. Exemplarily, the core layer thin film 200 is amorphous silicon. Exemplarily, one or more hard mask layers may be grown before and after the core layer thin film 200 is grown according to process requirements to improve the etching selection ratio of subsequent etching processes.

Figure 9:
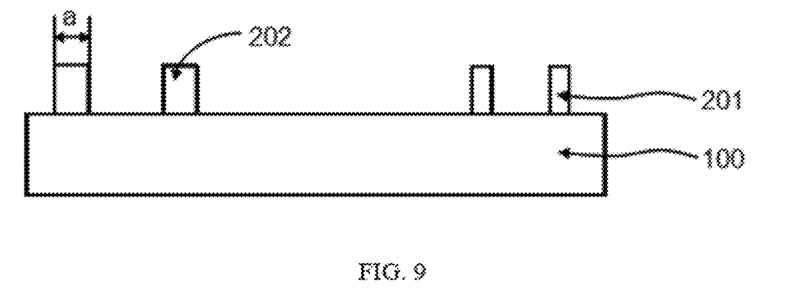

In step S2, referring to FIG. 9, photolithography and etching are performed for a first time to form a first core layer pattern 201 and a second core layer pattern 202. The first core layer pattern 201 is used to form fins. The second core layer pattern 202 is used to form a reference layer overlay mark. The number of the first core layer pattern 201 is at least one. Exemplarily, the number of the first core layer pattern 201 is two in this embodiment. The number of the second core layer pattern 202 is at least one. Exemplarily, the number of the second core layer pattern 202 is two in this embodiment.

The width a of the second core layer pattern 202 depends on the width (not shown in the figure) of the corresponding reference layer overlay mark on the used mask. The photolithography for the first time is used as a reference layer for alignment and overlay of subsequent photolithography layers. Therefore, the quality of the reference layer alignment and overlay mark formed through the photolithography and etching processes for the first time will directly affect the alignment and overlay accuracy of subsequent photolithography layers. One or more reference layer overlay mark patterns with different widths or types may be designed on the mask used in the photolithography for the first time according to process requirements.

That is, in the case of multiple second core layer patterns 202, the width and type of the multiple second core layer patterns 202 may be different.

The photolithography mentioned in this step and other steps may include photoresist coating, soft baking, mask alignment, exposure, baking after exposure, photoresist development, washing, drying, and etching with exposed and developed photoresist. Exemplarily, the photolithography process may be implemented, supplemented, or replaced by other methods, such as maskless photolithography, electron beam writing, and ion beam writing.

The etching process mentioned in this and other steps includes dry etching, wet etching, and/or other etching methods, such as reactive ion etching.

Figure 10:
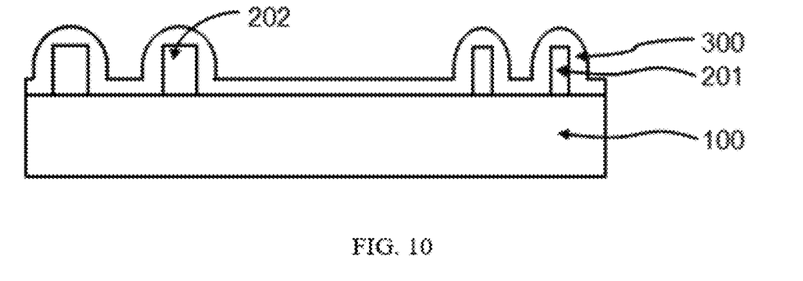

In step S3, referring to FIG. 10, an etching mask layer 300 is deposited. The etching mask layer 300 covers tops and side surfaces of the first core layer pattern 201 and the second core layer pattern 202, and a surface of the substrate 100. The etching selection ratio of the material of the etching mask layer 300 to the material of the core layer thin film 200 and the material of the substrate 100 is certain (more than 3:1, for example).

The deposition in this step and other steps may be implemented by adopting any suitable technology such as Physical Vapor Deposition (PVD), Chemical Vapor Deposition (CVD), High-Density Plasma CVD (HDP-CVD) or Atomic Layer Deposition (ALD).

Figure 11:
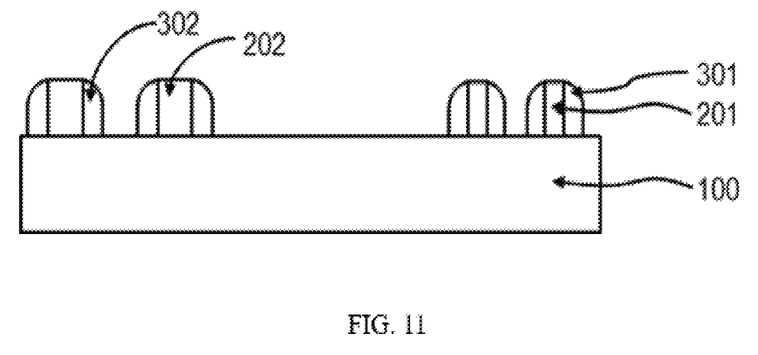

In step S4, referring to FIG. 11, the etching mask layer 300 is etched back to form sidewalls 301 of the first core layer pattern and sidewalls 302 of the second core layer pattern.

After the etching mask layer 300 is etched back, the tops of the first core layer pattern 201 and the second core layer pattern 202 and the surface of the substrate 100 are exposed.

The sidewalls 301 of the first core layer pattern are formed on side surfaces of the first core layer pattern 201. The sidewalls 302 of the second core layer pattern are formed on side surfaces of the second core layer pattern 202.

Figure 12:
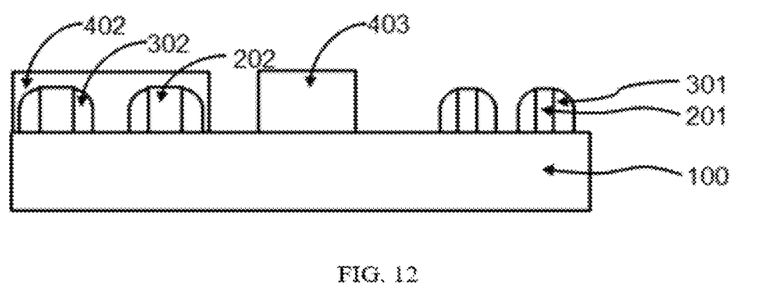

In step S5, referring to FIG. 12, photolithography is performed for a second time to form a first photoresist pattern 403 and a second photoresist pattern 402. The first photoresist pattern 403 is used to form a planar active area. The second photoresist pattern 402 covers the second core layer pattern 202.

Figure 13:
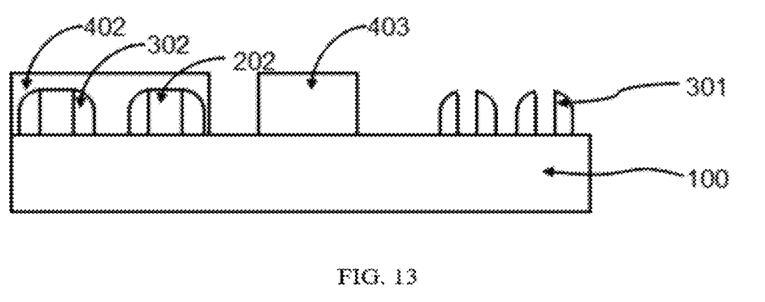

In step S6, referring to FIG. 13, the first core layer pattern 201 is removed, the sidewalls of the first core layer pattern 301 are reserved, and the second photoresist pattern 402 and the first photoresist pattern 403 are reserved. The etching selection ratio of the material of the first core layer pattern 201 to the material of the sidewalls 301 of the first core layer pattern and the material of the second photoresist pattern 402 and the first photoresist pattern 403 is certain (more than 3:1, for example).

Figure 14:
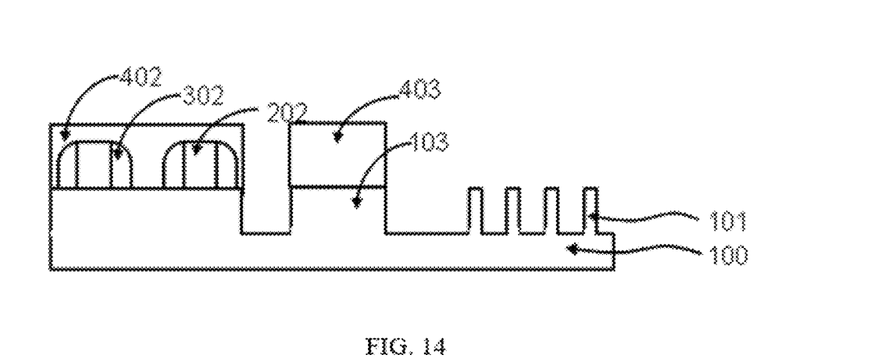

In step S7, referring to FIG. 14, the substrate 100 is etched for a first time to form the fins 101 and the planar active area 103 consisting of a substrate material. The substrate is etched for the first time by using the sidewalls 301 of the second photoresist pattern 402, the first photoresist pattern 403 and the first core layer pattern as an etching mask.

Figure 15:
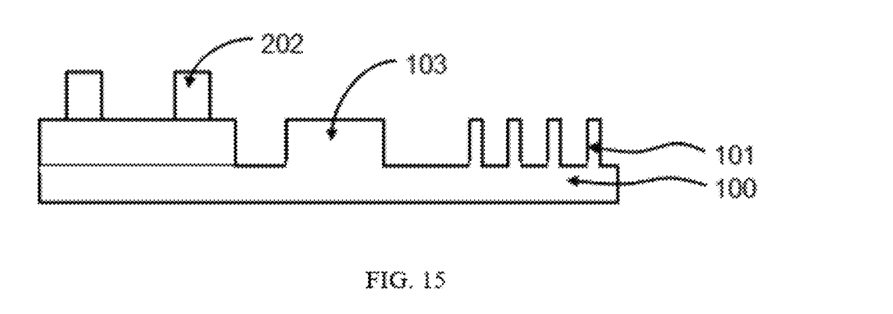

In step S8, referring to FIG. 15, the sidewalls 302 of the first photoresist pattern 403, the second photoresist pattern 402 and the second core layer pattern are removed, and the second core layer pattern 202 is reserved.

Figure 16:
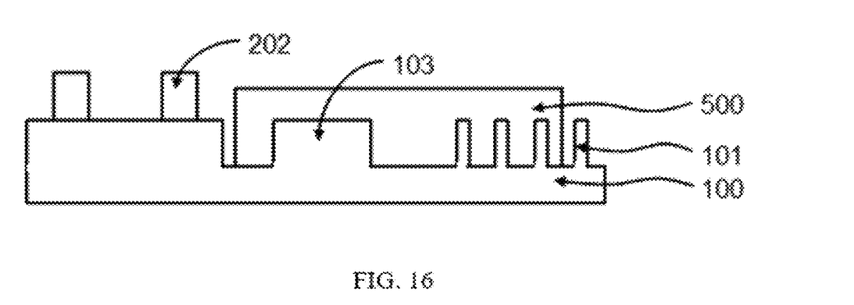

In step S9, referring to FIG. 16, photolithography is performed for a third time to form a third photoresist pattern 500 which covers all the planar active area 103 and fins 101 required to be reserved, i.e., fins outside a fin cut area, and expose the second core layer pattern 202 and the fins 101 required to be cut, i.e., fins inside the fin cut area, and the exposed fins will be used as the fin cut area.

Figure 17:
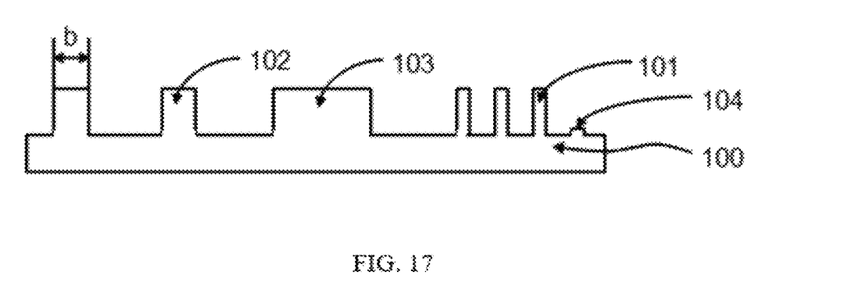

In step S10, referring to FIG. 17, the substrate 100 is etched for a second time to form at least one reference layer overlay mark 102 and the fin cut area 104 consisting of the substrate material. In this embodiment, the number of the reference layer overlay marks 102 is two. The substrate 100 is etched for the second time by using the third photoresist pattern 500 and the second core layer pattern 202 as an etching mask. Therefore, the width b of the reference layer overlay mark 102 is determined by the width a of the second core layer pattern 202. Further, the width b of the reference layer overlay mark 102 depends on the width (not shown) of the corresponding reference layer overlay mark pattern on the mask used in the first photolithography process described in step S2, In the traditional process, the width of the reference layer overlay mark is equal to the width of the fin.

Accordingly, it can be seen that the method for forming the fin structure in the fin field effect transistor process provided by the present application mainly achieves the following technical effects: by respectively forming multiple core layer patterns (first core layer pattern, second core layer pattern, and third core layer pattern) in the three photolithography processes, combined with the innovative process, on the basis of forming the fins, planar active area, and fin cut area of the traditional fin field effect transistor, a reference layer overlay mark is formed at the same time, the width of the reference layer overlay mark can be freely adjusted according to the process requirements, and the type of the reference layer overlay mark can also be designed freely according to the process requirements (while in the traditional process, the width of the reference layer overlay mark is equal to the width of the fin, the size is small and cannot be adjusted, and the type of the overlay mark cannot be designed freely), thus solving the problem that the reference layer overlay mark in the traditional fin field effect transistor process is easily destroyed by subsequent multiple processes, and thus solving the problem of inaccurate measurement of subsequent photolithography layer overlay accuracy.

The embodiment of the present application further provides a fin structure of a fin field effect transistor, which is fabricated by adopting the method for forming the fin structure in the fin field effect transistor process in the above embodiment. The fin structure comprises fins, a planar active area, a fin cut area and a reference layer overlay mark consisting of a substrate material. The width of the reference layer overlay mark is greater than the width of the fin. The width of the reference layer overlay mark is greater than the minimum width capable of being recognized by an overlay accuracy measuring machine.

What is claimed is:

1. A method for forming a fin structure in a fin field effect transistor process, comprising:
   step S1: growing a core layer thin film on a substrate;
   step S2: performing photolithography and etching for a first time to form a first core layer pattern and a second core layer pattern, the first core layer pattern being used to form fins and the second core layer pattern being used to form a reference layer overlay mark;
   step S3: depositing an etching mask layer, the etching mask layer covering tops and side surfaces of the first core layer pattern and the second core layer pattern, and a surface of the substrate;
   step S4: etching back the etching mask layer to form sidewalls of the first core layer pattern and sidewalls of the second core layer pattern;
   step S5: performing photolithography for a second time to form a first photoresist pattern and a second photoresist pattern, the first photoresist pattern being used to form a planar active area and the second photoresist pattern covering the second core layer pattern;
   step S6: removing the first core layer pattern, reserving the sidewalls of the first core layer pattern, and reserving the second photoresist pattern and the first photoresist pattern;
   step S7: etching the substrate for a first time to form the fins and the planar active area consisting of a substrate material;
   step S8: removing the first photoresist pattern, the second photoresist pattern, and the sidewalls of the second core layer pattern, and reserving the second core layer pattern;
   step S9: performing photolithography for a third time to form a third photoresist pattern which covers all of the planar active area and fins outside a fin cut area, and expose the second core layer pattern and the fins inside the fin cut area; and
   step S10: etching the substrate for a second time to form at least one reference layer overlay mark and the fin cut area consisting of the substrate material.

2. The method for forming the fin structure in the fin field effect transistor process according to claim 1, wherein the core layer thin film is one of a single-layer dielectric film layer, a single-layer metal film layer, or a single-layer metal compound film layer.

3. The method for forming the fin structure in the fin field effect transistor process according to claim 1, wherein the core layer thin film is a multilayer film layer and the multilayer film layer consists of a dielectric film layer and/or a metal film layer and/or a metal compound film layer.

4. The method for forming the fin structure in the fin field effect transistor process according to claim 1, wherein the core layer thin film is amorphous silicon.

5. The method for forming the fin structure in the fin field effect transistor process according to claim 1, wherein, in step S1, at least one hard mask layer is grown before and/or after the core layer thin film is grown.

6. The method for forming the fin structure in the fin field effect transistor process according to claim 1, wherein, in step S2, the photolithography for the first time is used as a reference layer for a subsequent photolithography layer alignment and overlay; and on a mask used in the photolithography for the first time, one or more reference layer overlay mark patterns with different widths or types are capable of being designed according to process requirements.

7. The method for forming the fin structure in the fin field effect transistor process according to claim 1, wherein the second core layer pattern comprises a plurality of second core layer patterns, and widths of the second core layer patterns are different.

8. The method for forming the fin structure in the fin field effect transistor process according to claim 1, wherein the second core layer pattern comprises a plurality of second core layer patterns, and types of the second core layer patterns are different.

9. The method for forming the fin structure in the fin field effect transistor process according to claim 1, wherein an etching selection ratio of a material of the etching mask layer to a material of the core layer thin film is more than 3:1.

10. The method for forming the fin structure in the fin field effect transistor process according to claim 1, wherein an etching selection ratio of a material of the etching mask layer to the substrate material is more than 3:1.

11. The method for forming the fin structure in the fin field effect transistor process according to claim 1, wherein, in step S4, after the etching mask layer is etched back, the tops of the first core layer pattern and the second core layer pattern and the surface of the substrate are exposed.

12. The method for forming the fin structure in the fin field effect transistor process according to claim 1, wherein an etching selection ratio of a material of the first core layer pattern to a material of the sidewalls of the first core layer pattern is more than 3:1.

13. The method for forming the fin structure in the fin field effect transistor process according to claim 1, wherein an etching selection ratio of a material of the first core layer pattern to a material of the first photoresist pattern and a material of the second photoresist pattern is more than 3:1.

14. The method for forming the fin structure in the fin field effect transistor process according to claim 1, wherein, in step S7, the substrate is etched for the first time by using the sidewalls of the second photoresist pattern, the first photoresist pattern, and the first core layer pattern as an etching mask.

15. The method for forming the fin structure in the fin field effect transistor process according to claim 1, wherein, in step S10, the substrate is etched for the second time by using the third photoresist pattern and the second core layer pattern as an etching mask.

16. The method for forming the fin structure in the fin field effect transistor process according to claim 1, wherein a width of the reference layer overlay mark is determined by a width of the second core layer pattern.

17. The method for forming the fin structure in the fin field effect transistor process according to claim 1, wherein a type of the reference layer overlay mark is determined by a type of the second core layer pattern.

18. The fin structure of a fin field effect transistor, wherein the fin structure is fabricated by adopting the method of claim 1.

19. The fin structure of the fin field effect transistor according to claim 18, wherein the fin structure comprises the fins, the planar active area, the fin cut area, and the reference layer overlay mark consisting of the substrate material, and wherein a width of the reference layer overlay mark is greater than a width of the fin structure.

20. The fin structure of the fin field effect transistor according to claim 18, wherein a width of the reference layer overlay mark is greater than a minimum width capable of being recognized by an overlay accuracy measuring machine.

* * * * *